(12) United States Patent
Pierrat et al.

(10) Patent No.: US 6,178,360 B1
(45) Date of Patent: Jan. 23, 2001

(54) METHODS AND APPARATUS FOR DETERMINING OPTIMUM EXPOSURE THRESHOLD FOR A GIVEN PHOTOLITHOGRAPHIC MODEL

(75) Inventors: Christophe Pierrat, Boise, ID (US); James Burdorf, Tualatin, OR (US)

(73) Assignee: Micron Technology, Inc., Boise, ID (US)

( * ) Notice: Under 35 U.S.C. 154(b), the term of this patent shall be extended for 0 days.

(21) Appl. No.: 09/019,208

(22) Filed: Feb. 5, 1998

(51) Int. Cl.[7] .................................................... G06F 19/00
(52) U.S. Cl. ................................ 700/121; 700/30; 700/31
(58) Field of Search ................................ 700/30, 31, 121, 700/28

(56) References Cited

U.S. PATENT DOCUMENTS

| | | | |
|---|---|---|---|
| 5,552,996 | * | 9/1996 | Hoffman et al. ............ 364/468.28 |
| 5,646,870 | * | 7/1997 | Krivokapic et al. ............ 364/578 |
| 5,663,076 | * | 9/1997 | Rostoker et al. ................. 438/14 |

OTHER PUBLICATIONS

Born, M., et al., *Principles of Optics: Electromagnetic Theory of Propagation, Interference and Diffraction of Light*, Pergamon Press, New York, 508–513, (1980).*

Cobb, N., et al., "Fast Sparse Aerial Image Calculation for OPC", *SPIE–The International Society for Optical Engineering, 2621*, 534–545, (1995).

Stirniman, J., et al., "Spatial Filter Models to Describe IC Lithographic Behavior", *Optical Microlithography X : Proceedings for SPIE, 3051*, Santa Clara, CA, 469–478, (Mar. 1997).

Wolf, S., et al., *Silicon Processing for the VLSI Era, vol. 1—Process Technology*, Lattice Press, Sunset Beach, CA, 409–413, 465–468, 48, (1986).

* cited by examiner

*Primary Examiner*—William Grant
*Assistant Examiner*—Zoila Cabrera
(74) *Attorney, Agent, or Firm*—Schwegman, Lundberg, Woessner & Kluth, P.A.

(57) ABSTRACT

A system and method for enhancing process latitude (tolerances) in the fabrication of devices and integrated circuits. A measuring point is selected corresponding to a feature of critical dimension. Then the pattern is convolved with the model, and its value and rate of change are calculated over a range of corresponding values of a first process parameter. Next, an optimum threshold having the largest rate of change, or contrast, is selected. Finally, proximity correction is performed using relevant parameters.

27 Claims, 8 Drawing Sheets

METHODS AND APPARATUS FOR DETERMINING OPTIMUM EXPOSURE THRESHOLD FOR A GIVEN PHOTOLITHOGRAPHIC MODEL

FIELD OF THE INVENTION

The present invention relates generally to a low cost method and system for enhancing the tolerances of process steps used to fabricate integrated circuits and discrete devices, and more specifically to a low cost method for determining the optimum latitude of the process steps using computer modeling.

BACKGROUND OF THE INVENTION

Devices and integrated circuits are fabricated with multiple processing steps. Integrated circuits are often fabricated with one or more devices, which may include diodes, capacitors, and different varieties of transistors. These devices often have microscopic features that can only be manufactured with critical processing steps that require careful alignment of equipment used to build the devices.

Critical processing steps are used to fabricate device features having small dimensions, known as critical dimensions. Critical dimensions of a device often define the performance of the device and its surrounding circuitry. For example, gate length is a critical dimension of a field effect transistor and establishes, in part, the maximum operating frequency of the transistor.

If a critical processing step is not reproducible, the critical dimension cannot be repeatably obtained. Then, the performance of many devices and integrated circuits may not be acceptable. As a result, processing yields decrease and production costs increase. It is therefore desirable to enhance the latitude of processing steps, particularly critical processing steps.

A critical dimension can be measured at different stages of device and integrated circuit fabrication. Fabrication may include many successive steps. First, energy, such as light, is exposed through a mask onto a masking layer, such as resist. As shown in FIG. 1(a), during exposure (step 110), the critical dimension 101 can be measured as the length of the footprint of energy 103 incident on the masking layer 102. Any masking layer 102 having a minimum dose of energy 103 incident upon it is exposed. Then, the exposed masking layer is developed so that, for example, only unexposed masking layer 104 remains, as shown in FIG. 1(b). During development (step 120), the critical dimension 101 can be measured as the distance between unexposed masking layers 104, as shown in FIG. 1(b). Then, as shown in FIG. 1(c), material 105 not covered by the unexposed masking layer 104 is removed. The removal step (step 130) may be accomplished with etching. The material 105 may be a base layer, such as a semiconductor substrate or wafer. During removal (step 130), the critical dimension 101 can be measured as the distance between remaining material 105, as shown in FIG. 1(c). As an alternative to removal (step 140), a conductor 106 may be deposited between the unexposed masking layer 104 which is then removed, as shown in FIG. 1(d). The conductor 106 may form the gate of a transistor. The conductor 106 may be metal, doped polysilicon, or a combination thereof. During deposition (step 140), the critical dimension 101 can be measured as the length of the conductor 106.

Conventionally, enhanced processing latitude for critical dimensions are obtained by modifying the exposure (step 110). The exposure (step 110) is a critical processing step also known as lithography. Optical or photolithography involves patterning the masking layer 102 with energy from light. A photolithographic system 200 is illustrated in FIG. 2. Photolithography entails exposing light 203 through a mask 208 onto the masking layer 102. The masking layer 102 is formed on material 105, such as a base layer, described above.

The mask 208 is a tool used to construct a device or integrated circuit. The design of the mask is created by a human, a computer or both thereof. The mask 208 has a pattern 209 formed by a mask material 206, such as chrome, adjacent to a translucent material 205, such as quartz. Light 203 passes through the mask 208 where no mask material 206 is present. Typically, a lens 207 is placed between the mask 208 and the masking layer 102 to focus the light 203 onto the masking layer 102. The light 203 exposes the mask's pattern 209 onto the masking layer 102. The mask material 206 also defines a critical dimension 201 of the mask 208. The critical dimension 201 of the mask 208 corresponds to the critical dimensions 101, described above, on a wafer. However, the critical dimension 201 of the mask 208 may not be equivalent to the critical dimension 101 on the wafer. Often, the amount of mask material 206 defining the critical dimension 201 will be modified to enhance the latitude of the process steps used to fabricate wafer features having a critical dimension 101. Other parameters, such as mask material 206 width, exposure dose, and focus, can also be adjusted singly or in combination to achieve the critical dimension 101 on the wafer.

Conventionally, enhanced processing latitude for critical dimensions 101 are experimentally obtained by modifying process parameters. A series of test patterns is created. The test patterns are derived from the original pattern used to create structures having critical dimensions 101, but may have mask material edge positions varying about the original pattern defining the critical dimension 101. The test and original patterns are used to fabricate features using a matrix of processing parameters. The processing parameters may include photolithographic, resist development, and etch effect parameters. For example, the photolithographic parameters may include light exposure time and depth of focus of light. These processing parameters are known to persons skilled in the art.

Subsequently, one test pattern is chosen that demonstrates the least sensitivity to variations in process parameters. The chosen test pattern must form a feature with an accurate critical dimension 101 with specific process parameters. This procedure is laborious and expensive because it requires fabricating and analyzing multiple patterns formed with many different process parameters. Hence, only a finite amount of test patterns can practically be fabricated with different parameters. As a result of this constraint, process latitude can be enhanced to only a coarse extent. It is therefore desirable to more accurately and inexpensively enhance the latitude of the process parameters. This latitude is sometimes known as the contrast of the process. A high contrast indicates a high tolerance to process variation. A high contrast is desirable because a relatively large change in the process will induce a relatively small change of an edge position, possibly affecting a critical dimension 101, on a wafer.

Typically, the mask features are formed with distortion on a device or an integrated circuit as a result of nonlinear process effects. Nonlinear process effects occur during many processing steps, including exposure (step 110) and development (step 120). For example, distortion may occur during exposure (step 110) as a result of optical diffraction.

Also, distortion may occur during development (step 120) as a result of resist swelling. Nonlinear processing effects are described in *Silicon Processing for the VLSI Era* by Wolf et al., which is herein incorporated by reference. The nonlinear processing effects can be analytically described with theoretical or empirical models. These models are known by persons skilled in the art. For example, optical nonlinear effects are described in *Principles of Optics* by Born et al., which is herein incorporated by reference. Such models may be used to simulate fabrication of a device or an integrated circuit in software, such as the FAIM program by Vector Technology (Brookline, Mass.), or programs from Precim Company (Portland, Oreg.).

Models may consist of one or more kernels, typically three-dimensional functions. When a model is convolved with a pattern, the behavior of that pattern at a specific point may be predicted. If many points are taken, a three-dimensional behavior can be predicted. A model threshold is a value that, when subtracted from the value of the model, can convert the modeled behavior to a binary behavior. For example, when a threshold of 0.3 is chosen, the model is convolved with the pattern and a value of 0.35 is returned. Subtracting 0.30 from 0.35 suggests that the pattern has a positive behavior at this point. Additionally, a shifted behavior can be used by retaining the calculated differential magnitude, e.g., 0.05. This information can be interpreted in any number of ways, depending on the specific application.

Conventionally, after process latitudes have been coarsely enhanced by experimentally choosing a test pattern and process parameters, the definition of features on the mask may be modified by proximity effect correction (PEC). Generally, PEC can be accomplished either manually using experimental data or using simulation software for feedback, or automatically with software using a rules-based method, or a model-based method. Examples of such software are Optimask from Vector Technology (Brookline, Mass.), Proteus from Precim Company (Portland, Oreg.), and OPRX from Trans Vector Technology (Camarillo, Calif.). Using a model-based method, the kernels are convolved with the original mask layout, compared to a threshold to determine the distortion, and a new mask pattern is created whose features will have diminished distortion when formed in an integrated circuit or device. The use of model-based PEC is well known to persons skilled in the art. The use of models to diminish distortions in fabricated features is further described in "Fast Sparse Aerial Image Calculation for OPC," 15th Annual Symposium on Photomask Technology and Management, 1995, by N. Cobb et al., and "Spatial Filter Models to Describe IC Lithographic Behavior," the Optical Microlithography SPIE 1997 Proceedings, Vol. 3051, pp. 469–478, by J. P. Stirniman et al., which are hereby incorporated by reference.

The specific process parameters determined by experiment, described previously, can be supplied to proximity effect correction software. To reduce cost and enhance accuracy, it is desirable to automatically transfer the process parameters to the proximity effect correction software.

SUMMARY OF THE INVENTION

The present invention is a system and method for enhancing process latitude, or tolerance, in the fabrication of devices and integrated circuits. A measuring point is selected corresponding to a feature of critical dimension. Then the pattern is convolved with the model, and its value and rate of change are calculated over a range of corresponding values of a first process parameter. Next, an optimum threshold having the largest rate of change, or contrast, is selected. Finally, proximity correction is performed using relevant parameters.

The method may be implemented in a computer including a processor and a memory. A first calculating process enables the processor to calculate modeled behavior values and their rates of change over a range of corresponding values of the first process parameter. A second calculating process enables the processor to select the optimum threshold. Proximity correction is performed using the optimum threshold. Proximity correction can be performed manually using simulation software for feedback, or automatically with software. Because the method is implemented in a computer, the model parameters can be determined efficiently over finer incremental values of the first process parameter. Therefore, the parameters can be more precisely and inexpensively determined.

In one embodiment, the first process parameter may be mask material edge position in a computer representation of a mask. In one such embodiment, for instance, the optimum threshold is provided to a proximity effect correction process in which the computer representation of the mask is modified to compensate for proximity effects. As a result, the masks can be automatically or semi-automatically sequentially optimized for process latitude and proximity effect correction with a single computer program.

In a second embodiment, the first process parameter may be an optical parameter of a stepper, for example, numerical aperture. In this embodiment, the numerical aperture of the model is varied to determine the value that corresponds to the maximum rate of change of the modeled behavior. The maximum rate of change of the modeled behavior and its corresponding optimum threshold are provided to a proximity effect correction process in which the computer representation of the mask is modified to compensate for proximity effects.

Further features and advantages of the present invention, as well as the structure and operation of the various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the leftmost digit(s) of a reference number identifies the drawing in which the reference number first appears.

FIG. 1(*b*) is a cross-sectional view of prior art resist development;

FIG. 1(*c*) is a cross-sectional view of prior art material removal;

FIG. 1(*d*) is a cross-sectional view of prior art conductor deposition;

FIG. 3(*b*) is an aerial view of a computer representation of a wafer;

FIG. 4(*b*) is a flow chart of method for determining values and rates of change of a threshold;

DETAILED DESCRIPTION OF THE EMBODIMENTS

Figure 1A:
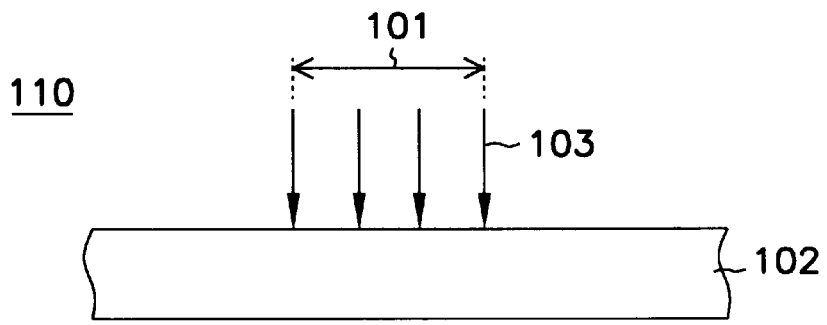
FIG. 1(*a*) is a cross-sectional view of prior art resist exposure.
Figure 1B:
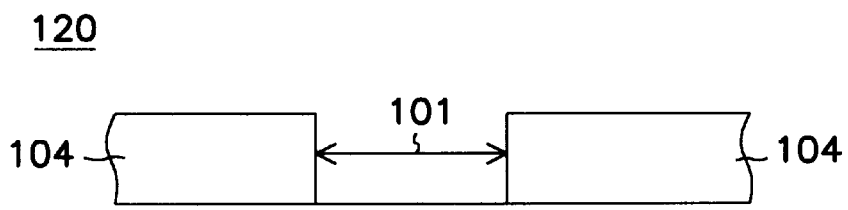
Figure 1C:
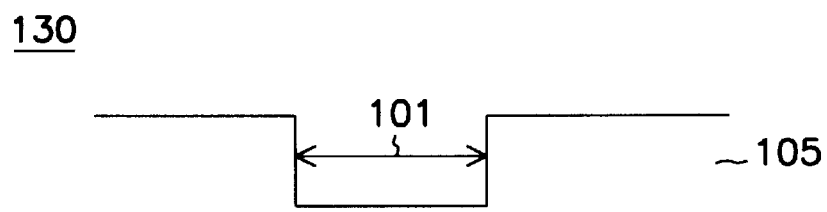
Figure 1D:
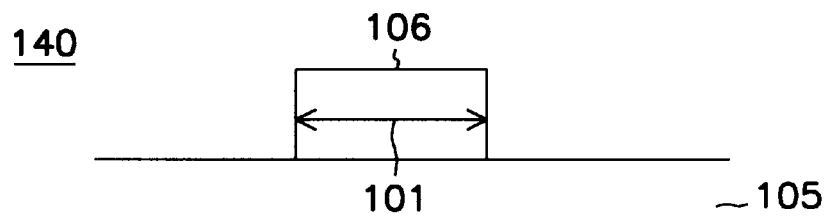
Figure 2:
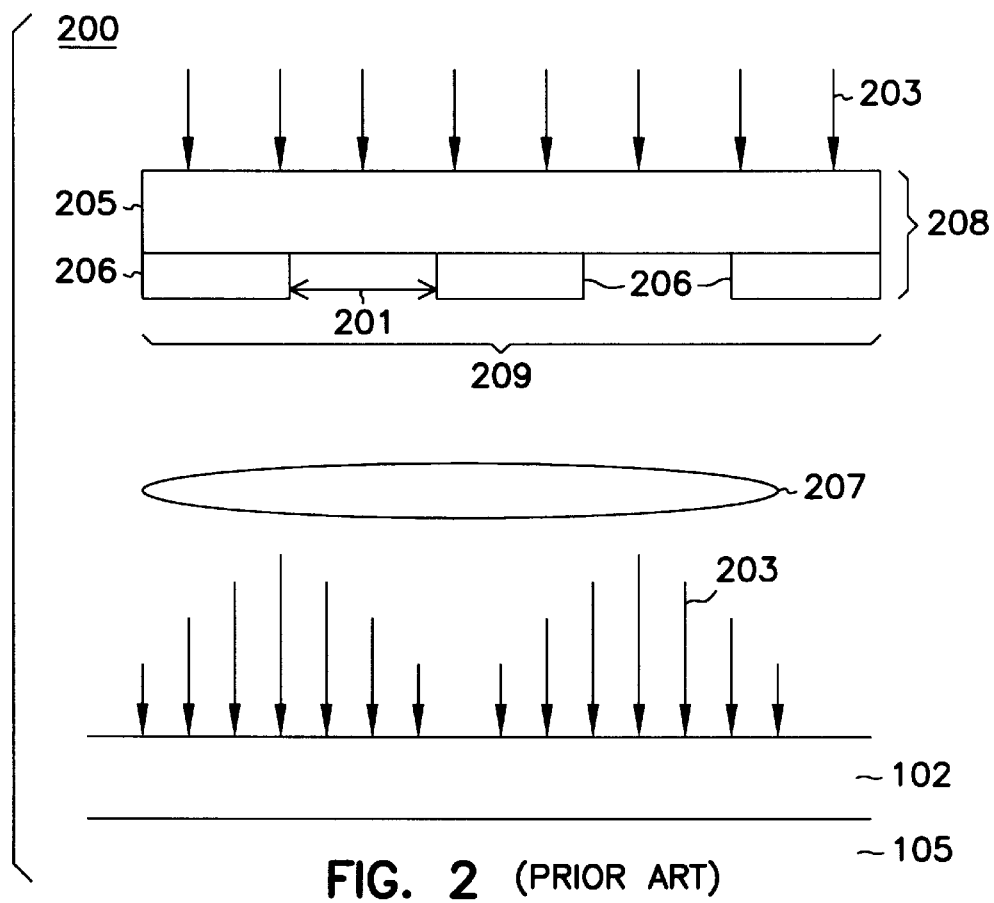
FIG. 2 is a cross-sectional view of a prior art photolithography system.

In the following detailed description of the preferred embodiments, reference is made to the accompanying drawings which form a part hereof, and in which is shown by way of illustration of specific preferred embodiments in which the inventions may be practiced. These embodiments are described in sufficient detail to enable persons skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

There are a large number of combinations of modeled behavior values and mask material edge position, or other process variables, that can provide a desired wafer edge position in a certain situation. Not all of these combinations have desirable process parameters or behaviors. The present invention is a system and method of selecting the best modeled behavior value, or threshold, based upon the contrast or slope of the model behavior. Given this threshold, a proximity effect correction program will yield the previously determined mask material edge position. When a mask 208 is created from the corrected data, and a wafer processed, the process latitude, or contrast of the evaluated point(s) should be maximized. This technique can be extended, and instead of moving the mask material edge, the modeled behavior value itself can be varied while keeping the mask material edge constant to find the best model conditions, such as stepper numerical aperture, focus, or on or off axis settings. Thus, for example, the best stepper condition and threshold can be presented to the proximity effect correction software to adjust the mask material edge everywhere on the mask 208 accordingly. In one embodiment, this last step is not necessary, as the best stepper conditions provide the desired result.

In a general sense, what is described below is a computer-implemented method for determining an optimal process parameter for the fabrication of devices and integrated circuits comprising selecting an initial position corresponding to a feature of critical dimension. Then, modeled behavior values and their rates of change are calculated over a range of corresponding values of a first process parameter. Next, an optimum threshold corresponding to the largest rate of change of the modeled behavior is selected. Finally, proximity correction is performed using the optimal threshold and, possibly, additional information. The present invention may arrive at an optimal threshold and, optionally, corresponding process parameters by simulating one or more processing steps described above. For example, the present invention may simulate only the exposure step (step 110). Alternatively, the present invention may simulate the exposure, development and etch steps (steps 110, 120, 130).

Figure 3A:
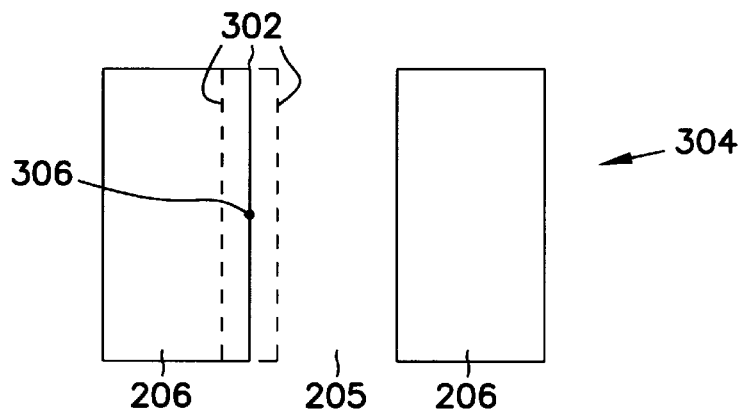
FIG. 3(*a*) is an aerial view of a computer representation of a mask.
Figure 3B:
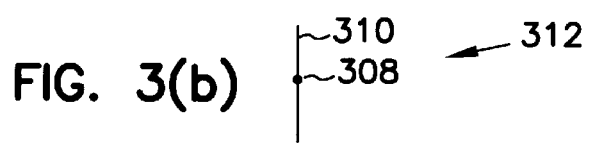
Figure 4A:
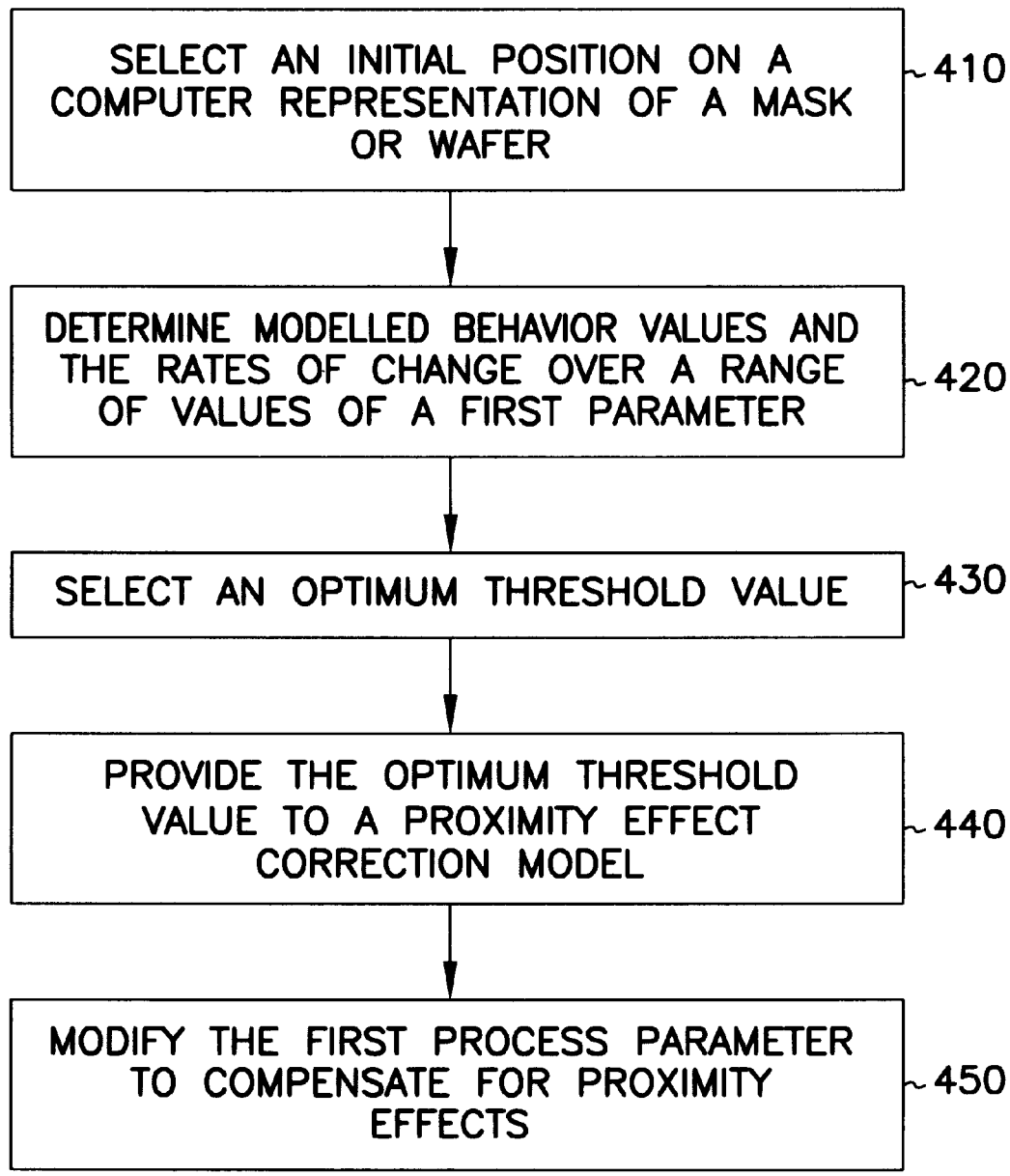
FIG. 4(*a*) is a flow chart of a method for modeling a semiconductor process.
FIG. 4(c) is a flow chart of a method for modeling a photolithographic process.

The present invention will now be described in detail. In one embodiment, the first process parameter is the position of a mask material edge in a mask. In such an embodiment, the optimal threshold is determined as follows. First, an initial position of a mask material edge 302 on a computer representation of a mask 304 is selected (step 410), as illustrated in FIGS. 3(a) and 4(a). The initial position, in part, defines a feature of critical dimension on the wafer (e.g., the width of a line). FIG. 3(a) illustrates an exemplary initial position 306 on a computer representation of a mask 304. A measuring point 308 on the computer representation of the wafer 312 is then selected and a threshold selected to create an edge 310 at that measuring point 308, as shown in FIG. 3(b). The measuring point 308 on the computer representation of the wafer 312 is located on an edge 310 that defines a feature of critical dimension of a device of the wafer.

Then, the value and rate of change of a modeled behavior at the measuring point 308 on the computer representation of a wafer 312 over a range of a first process parameters is determined by computer simulation (step 420). Each model value is a potential threshold. In this embodiment, the modeled behavior value and its rate of change are dependent variables. The measuring point 308 and the first process parameter are independent variables. Thus, for a given measuring point 308, the first process parameter is incremented or decremented by a desired amount over a desired range of values. The value and the rate of change of the modeled behavior are then calculated at the measuring point 308 on the computer representation of the wafer for each incremental value of the first process parameter. The incremental values of the first process parameter, and the corresponding values of the model and its rate of change may be stored in a table.

In a photolithographic process, for example, the first process parameter may be the edge position 302 of the mask material 206 in the computer representation of the mask 208. This example will be described below in more detail.

Next, the optimum threshold is selected (step 430). The optimum threshold is equal to the model value having the greatest rate of change over the evaluated range of first process parameter values. The optimum threshold is the point at which processing latitudes are optimized. Thus, both the threshold and the first process parameter can be more precisely and inexpensively determined to maximize process latitude.

Then, the optimum threshold and, optionally, the corresponding first process parameter, are provided to a proximity effect correction (PEC) process (step 440). The PEC process modifies the mask material edge positions 302 over the mask 208 or base layer to compensate for proximity effects (step 450), described above. Thus, the mask or base layer can be automatically or semi-automatically sequentially optimized for process latitude and proximity effect correction with a single computer program.

Figure 4B:
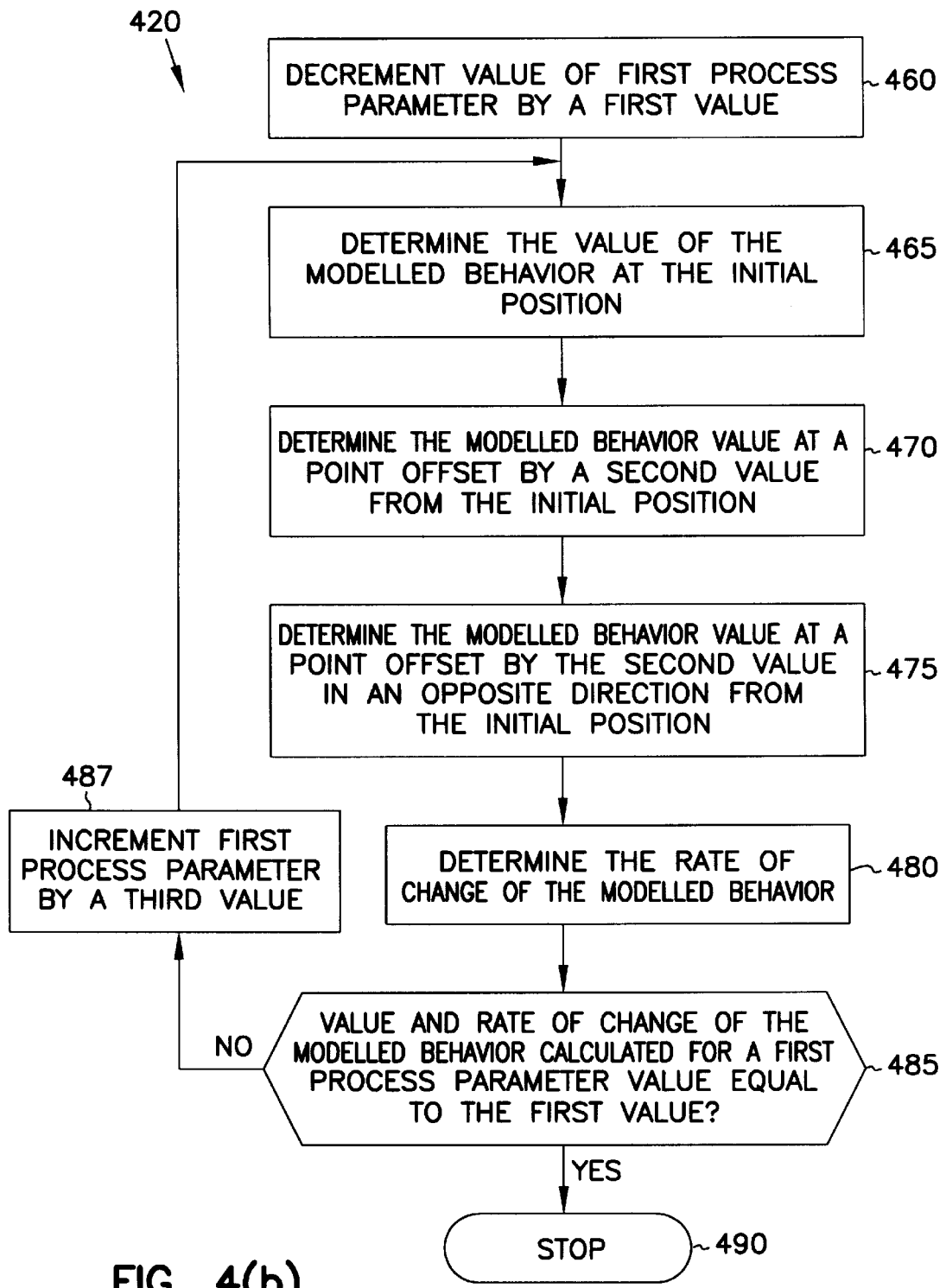

The value and rate of change of the modeled behavior with respect to the measuring point 308 on the computer representation of the wafer 312 is determined (step 420) in a manner known to persons skilled in the art. Points on either side of measuring point 308 are selected and the rate of change of the modeled behavior across the three points is calculated. In an exemplary embodiment, the value and rate of change of the modeled behavior may be determined in the manner illustrated in FIG. 4(b). However, other embodiments of methods for determining the value and rate of change, different from the one described below, may also be used. First, the value of the first process parameter is decremented from an initial value by a first value (step 460).

Then, the value of the modeled behavior at the measuring point on the computer representation of the wafer 312 with respect to the first process parameter is determined or calculated (step 465) with the models described above. Next, the value of the modeled behavior is determined on the computer representation of the wafer 312 at a location that is offset by a second value from the measuring point 308 in one direction of change of the first process parameter (step 470). Then, the modeled behavior value is determined on the computer representation of the wafer 312 at a location that is offset by the second value from the measuring point 308 in the other direction of change of the first process parameter (step 475). Finally, the rate of change of the modeled behavior, at the measuring point 308 and corresponding to the value of the first process parameter, is determined or calculated (step 480). The rate of change is solved (step 480) by first calculating the difference of the modeled behavior values ascertained in steps 470 and 475. Then, the rate of change is determined by dividing the difference of the modeled behavior values by twice the second value. The values and rates of change of the modeled behavior and the corresponding values of the first parameter are entered into the table.

Next, it is determined whether the value and rate of change of the modeled behavior has been calculated for a first process parameter value equal to the first value (step 485). If these calculations have been performed, then the process is stopped (step 490). If these calculations have not been performed, then the first process parameter value is incremented by a third value (step 487). The third value may be chosen so that the first value can be divided by the third value without a remainder. In one such embodiment, the third value is $2^{-N}$ times the first value, where N is an integer greater than one. After performing step 487, steps 465, 470, 475, 480, and 485 are repeated.

It should be noted that the change in the first process parameters does not have to be symmetric around the initial value of the first process parameter. In addition, the step by which the first process parameter is changed in determining the optimum threshold does not have to be constant.

Figure 4C:
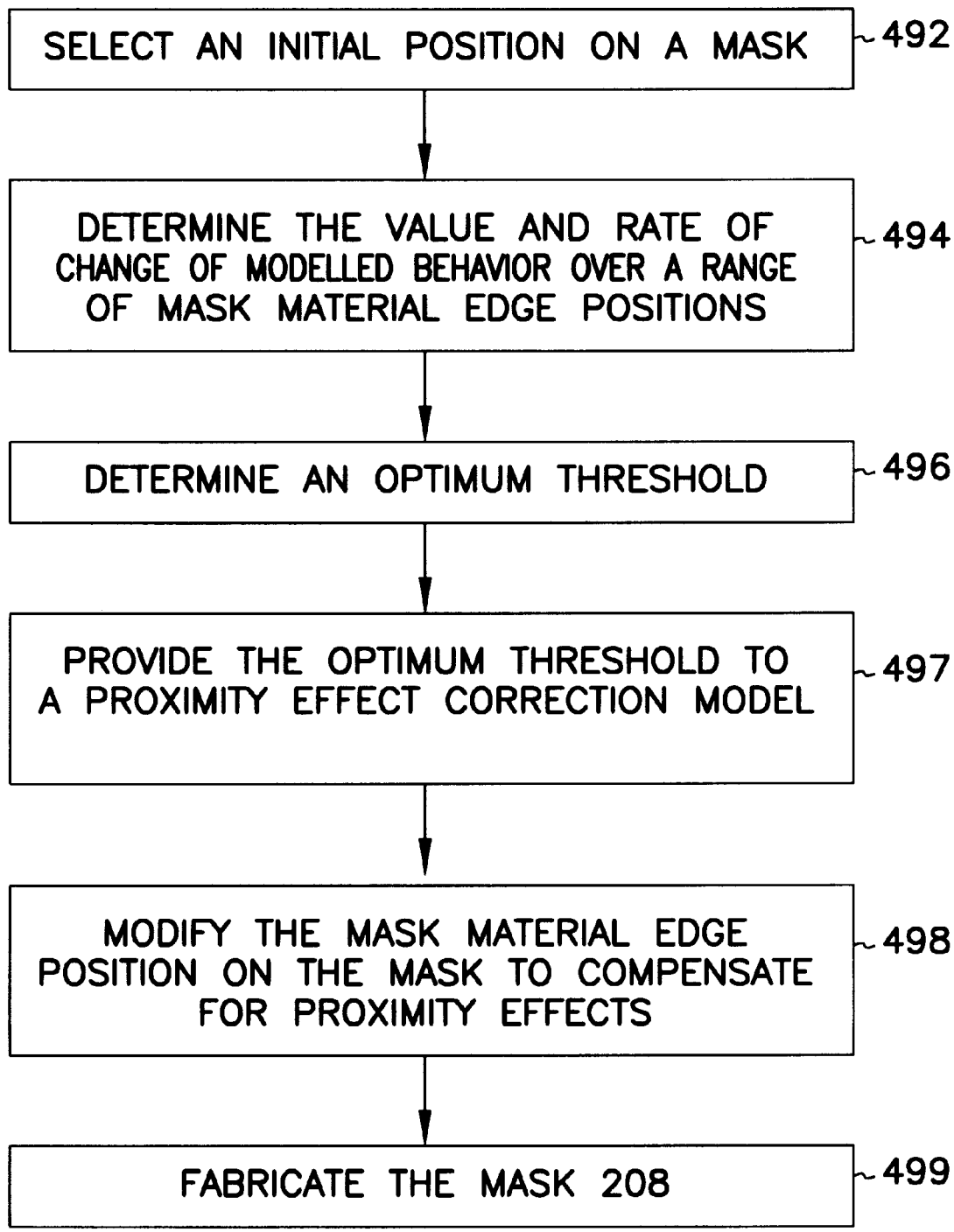

Operation of this exemplary embodiment of the present invention will now be described, as shown in FIG. 4(c). However, other embodiments may be performed differently. First, an initial position 306 on an edge of mask material 206 of the computer representation of the mask 304 which forms a feature of critical dimension is selected (step 492). Next, the value and rate of change of the modeled behavior are determined about a measuring point 308 on a computer representation of the wafer 312 over a range of modeled mask material edge positions (step 494). The rate of change (step 494) can be calculated by any standard method or can be calculated using the method (steps 470, 475, 480) described above. In one embodiment of such an approach, the second value ranges between one and ten nanometers. For instance, the modeled behavior value at the measuring point and at points ±10 nm from the measuring point may be used to calculate the rate of change in the modeled behavior value needed to place an edge 310 at the measuring point 308. The third value may be, for example, ten nanometers. Using the iterative technique (step 420) described above, the optimum threshold is then determined (step 496). Subsequently, the optimum threshold is provided to the PEC process described above (step 497). The PEC process can then correct proximity effects while maintaining maximum processing latitude. The PEC process modifies the mask material edge positions 302 to compensate for proximity effects (step 498). Finally, the mask 208 can be fabricated, incorporating the modified modeled mask material edge positions 302, using techniques known by persons skilled in the art (step 499).

Modifying the mask material edge position on the mask 208 to yield the maximum slope of the modeled behavior value at the measuring point 308 on the wafer will result in maximized process latitude. Both the modeled behavior value and the rate of change of the modeled behavior value can be determined more efficiently over finer variations of mask material with this method than by experimentation.

Figure 5A:
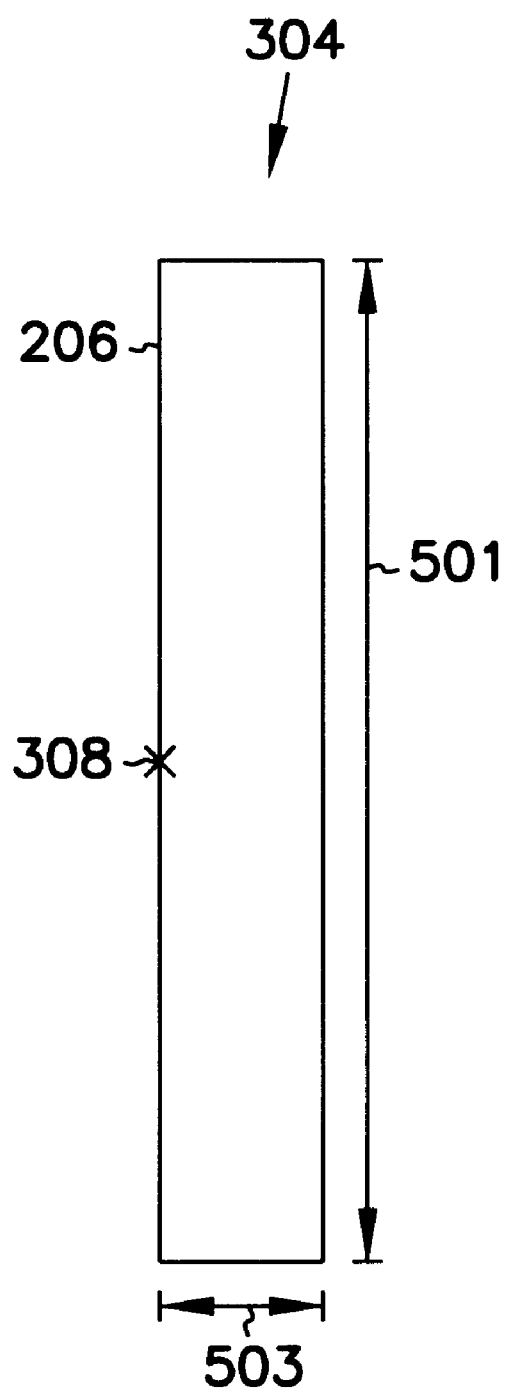
FIG. 5(a) is an illustration of a computer representation of a mask.
Figure 5B:
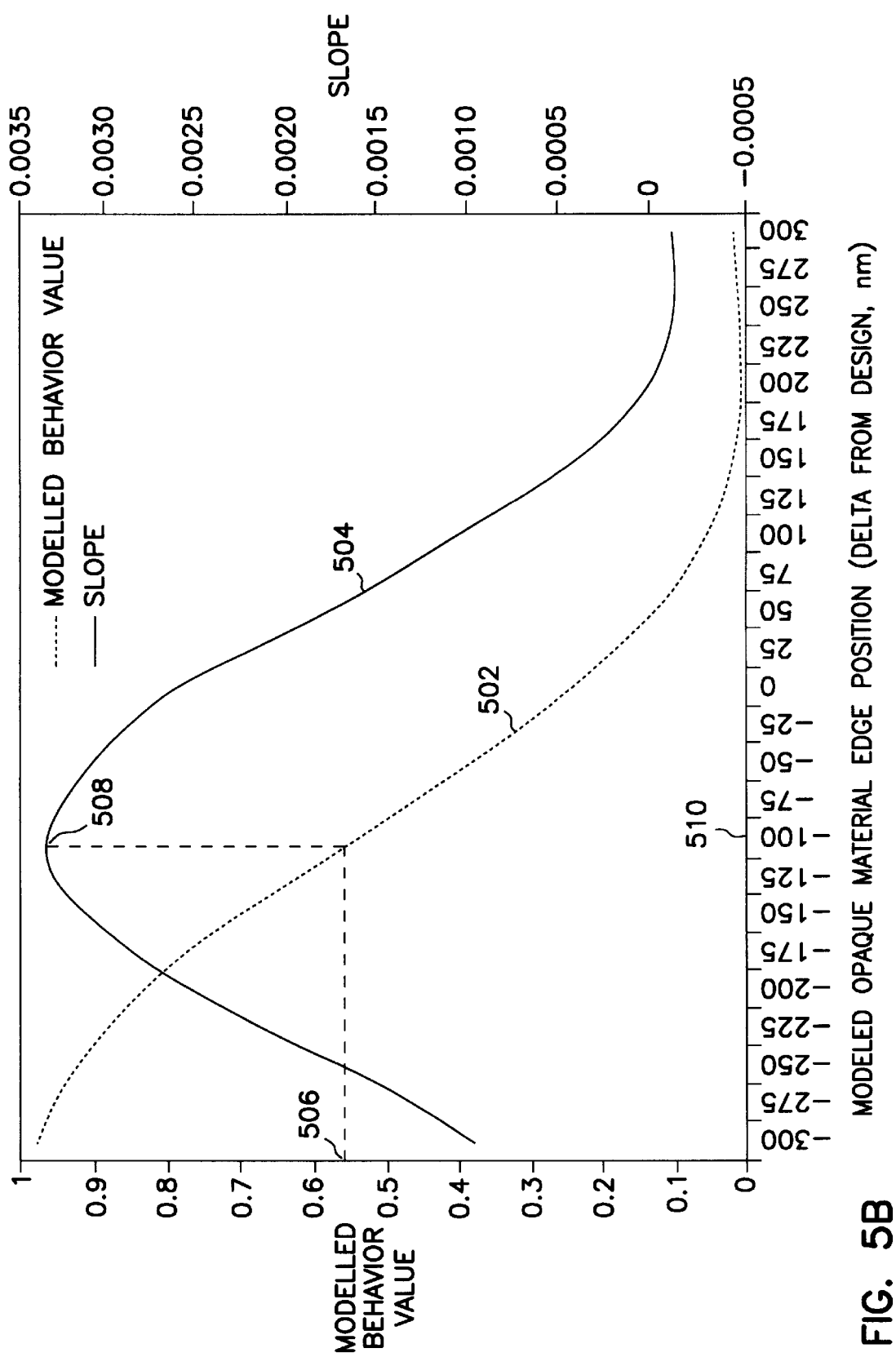
FIG. 5(b) is a diagram relating the values and slope of threshold with mask material edge position.

Exemplary results of performing the method described above will now be discussed. In this example, an optical model process is used. FIG. 5B illustrates a plot of threshold 502 and the rate of change, or slope, of the modeled behavior value 504 with respect to change in the modeled mask material edge position 510. The data for this plot was calculated for a measuring point 308 on a computer representation of a mask 304, having mask material 206 defining a feature of critical dimension, and corresponds to steps 492 and 494. In one example, the mask material 206 width 503 and length 501 may be respectively 400 nm and 3000 nm, as illustrated in FIG. 5A. The data is extracted from the previously described table. Modifying the mask material edge position of a mask 208 by the amount 510 to yield a maximum slope 508 of the threshold 502 will result in the latitude of the exposure (step 110) being maximized. Practically, this means that the exposure (step 110) will have enhanced contrast. Therefore, variations of photolithographic parameters affecting light intensity, such as exposure time and depth of focus, will have a diminished effect on the fabricated feature dimension of critical dimension. The optimum threshold value 506, or modeled behavior value having the maximum slope, is then determined (step 496). Then optimum threshold value 506 is provided to the PEC process (step 497) to modify the mask 208 to compensate for nonlinear effects during the exposure (step 110) that distort the features formed on the masking layer 102.

The optimum threshold value 506 can be determined for numerous measuring points 308 on the computer representation of the wafer 312. If the optimum thresh old values 506 vary at the different measuring points 308, a statistical analysis can be performed on the optimum threshold values 506. Various forms of statistical analysis are known to persons skilled in the art. Thus, a threshold value that is a function, such as the mean or median, of the optimum threshold values 506 can be determined and conveyed to the PEC process.

In addition, multiple models can be considered in the same way. Multiple models may include, for example, models for out-of-focus conditions, or different illumination conditions.

Figure 6:
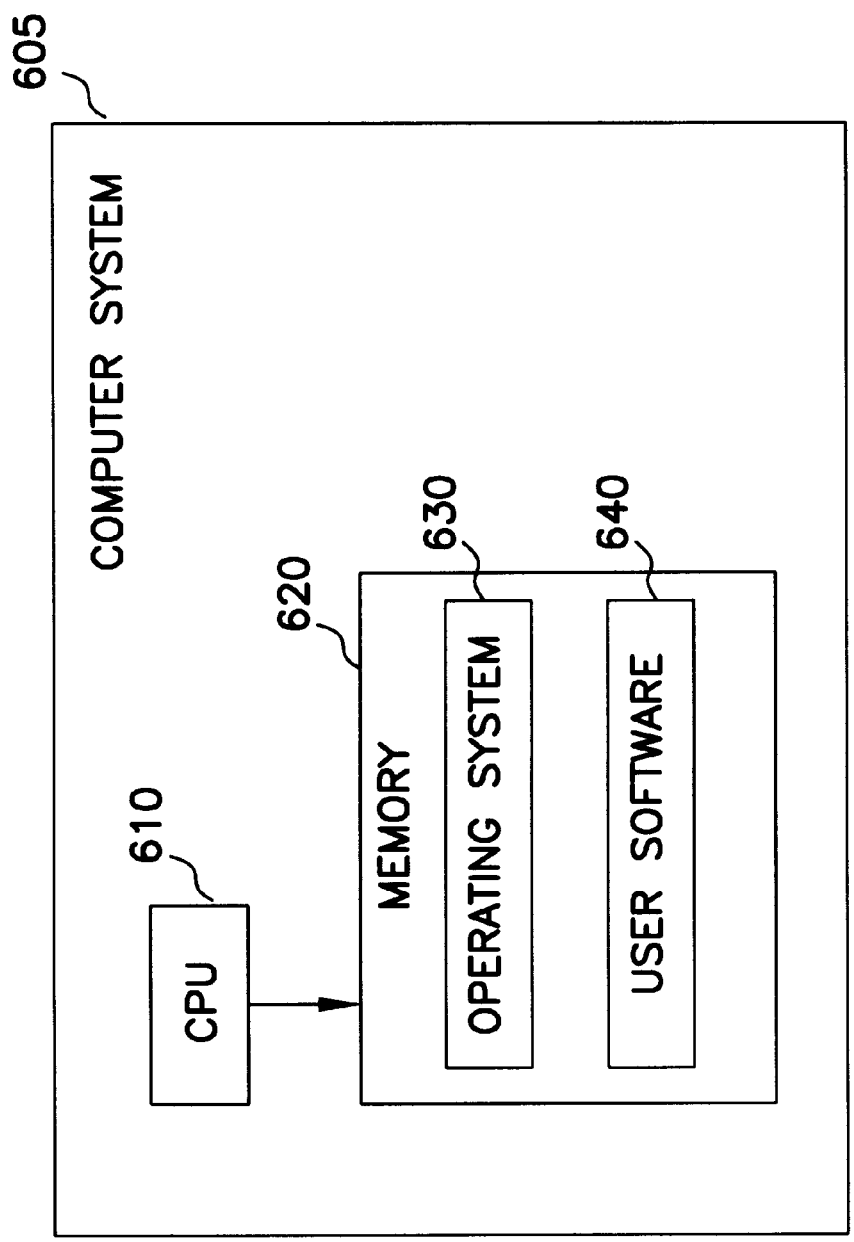
FIG. 6 is a block diagram of one embodiment of a computer system.

The aforementioned methods may be implemented in a computer system. FIG. 6 illustrates an exemplary computer system 605 that includes a central processing unit 610 and memory 620. The memory 620 can be random access memory, disk storage, CD-ROM storage, or another type of memory. Within the memory 620, the computer system 610 has access to its operating system 630 and user software 640. To implement the method of the present invention, user software 640 can include the PROTEUS program along with user-modified scripts. Alternatively, the user software can be user-developed software, or software from another vendor.

Conclusion

The present invention is an apparatus and method of determining the optimum process point in device and integrated circuit fabrication. The present invention uses a computer to increase the accuracy and reduce the cost of determining the best process point. Although specific embodiments have been illustrated and described herein, it will be appreciated by those of ordinary skill in the art that any arrangement which is calculated to achieve the same purpose may be substituted for the specific embodiments shown. This patent is intended to cover any adaptations or variations of the present invention. For example, the first process parameter may represent the focus, numerical aperture, exposure time, or on or off axis settings of a stepper. Also, the present invention can be implemented with a variety of masks, including, but not limited to, attenuated phase shift masks, alternating aperture phase shift masks, and chromeless phase shift masks. Also, other lithography techniques may be used, including, but not limited to, X-ray, ion, and electron beam lithography. Therefore, it is manifestly intended that this invention be limited only by the claims and the equivalents thereof.

We claim:

1. A method, in a computer, for determining an optimum process point for fabricating a device feature of a critical dimension, comprising:

selecting a measuring point on a computer representation of a wafer corresponding to the feature of the critical dimension;

calculating modeled behavior values and their rates of change over a range of corresponding values of a first process parameter representative of mask material edge position;

selecting an optimum threshold value having the largest rate of change around said measuring point; and determining the first process parameter value corresponding to the optimum threshold value.

2. The method of claim 1, wherein calculating modeled behavior values comprises calculating the modeled behavior values and their rates of change over a range of corresponding values of the first process parameter representative of focus.

3. The method of claim 1, wherein calculating modeled behavior values comprises calculating the modeled behavior values and their rates of change over a range of corresponding values of the first process parameter representative of numerical aperture.

4. The method of claim 1, wherein calculating modeled behavior values comprises:

selecting a point on one side of the measuring point;

calculating a value of the modeled behavior at each of the points; and calculating a slope through each of the points, wherein the slope is a function of the values of the modeled behavior at each point.

5. The method of claim 4, wherein calculating modeled behavior values further comprises selecting a second point.

6. The method of claim 1, wherein calculating threshold values and their rates of change comprises:

decrementing the value of the first process parameter;

calculating the value of the modeled behavior at the measuring point;

determining the value of the modeled behavior at a location offset from the measuring point in a first direction by a second value;

determining the value of the modeled behavior at a location offset from the measuring point in a second direction, opposite to the first direction, by the second value; and calculating the rate of change of the modeled behavior corresponding to the first process parameter value.

7. The method of claim 6, wherein calculating the rate of change comprises:

calculating a difference of the modeled behavior values ascertained during determining the values of the modeled behavior; and dividing the difference of the modeled behavior values by twice the second value.

8. A method, in a computer, for determining an optimum process point for fabricating a device feature of a critical dimension, comprising:

selecting a measuring point on a computer representation of a wafer corresponding to the feature of the critical dimension;

calculating modeled behavior values and their rates of change over a range of corresponding values of a first process parameter representative of mask material edge position;

selecting an optimum threshold value having the largest rate of change around said measuring point;

determining the first process parameter value corresponding to the optimum threshold value; and providing the optimum threshold value to a proximity effect correction process which modifies the mask pattern to compensate for proximity effects.

9. The method of claim 8, wherein calculating modeled behavior values comprises calculating the modeled behavior values and their rates of change over a range of corresponding values of the first process parameter of a computer representation of a mask.

10. The method of claim 8, wherein calculating modeled behavior values comprises calculating the modeled behavior values and their rates of change over a range of corresponding values of the first process parameter representative of focus.

11. The method of claim 8, wherein calculating modeled behavior values comprises calculating the modeled behavior values and their rates of change over a range of corresponding values of the first process parameter representative of numerical aperture.

12. A method, in a computer, for determining an optimum process point for fabricating a device feature of a critical dimension, comprising:

selecting a measuring point on a computer representation of a wafer corresponding to the feature of the critical dimension;

calculating modeled behavior values and their rates of change over a range of corresponding mask material edge positions; and selecting an optimum threshold value having the largest rate of change around said measuring point.

13. The method of claim 12, further comprising determining the mask material edge position corresponding to the optimum threshold value.

14. The method of claim 12, wherein calculating modeled behavior values and their rates of change comprises:

selecting a point on one side of the measuring point;

calculating a value of the modeled behavior at each of the points; and calculating a slope through each of the points, wherein the slope is a function of the values of the modeled behavior at each point.

15. The method of claim 12, wherein calculating modeled behavior values and their rates of change further comprises:

shifting the mask material edge position by a first value;

calculating the value of the modeled behavior at the measuring point;

determining the value of the modeled behavior at a location offset from the measuring point in a first direction by a second value;

determining the value of the modeled behavior at a location offset from the measuring point in a second direction, opposite the first direction, by the second value; and calculating the rate of change of the modeled behavior value corresponding to the mask material edge position.

16. The method of claim 15, wherein calculating the rate of change comprises:

calculating a difference of the modeled behavior values ascertained during determining the values of the modeled behavior; and dividing the difference of the modeled behavior values by twice the second value.

17. The method of claim 15, further comprising:

providing the optimum threshold value to a proximity effect correction process which modifies the mask material edge position to compensate for proximity effects.

18. A method, in a computer, for determining an optimum process point for fabricating a device feature of a critical dimension, comprising:

selecting a measuring point on a computer representation of a wafer corresponding to the feature of the critical dimension;

calculating modeled behavior values and their rates of change over a range of corresponding mask material edge positions, comprising:

shifting the mask material edge position by a first value;

calculating the value of the modeled behavior at the measuring point;

determining the value of the modeled behavior at a location offset from the measuring point in a first direction by a second value;

determining the value of the modeled behavior at a location offset from the measuring point in a second direction, opposite the first direction, by the second value; and calculating the rate of change of the threshold, comprising:

calculating a difference of the modeled behavior values ascertained during determining the values of the modeled behavior; and dividing the difference of the modeled behavior values by twice the second value;

selecting an optimum threshold value having the largest rate of change; and providing the optimum threshold value to a proximity effect correction process which modifies the mask material edge position to compensate for proximity effects.

19. A method, in a computer, for determining an optimum process point for fabricating a device feature of critical dimension, comprising:

selecting a plurality of measuring points, wherein each measuring point corresponds to the feature of the critical dimension;

calculating values and rates of change of modeled behavior over a range of values of a first process parameter for each measuring point, the range of values representative of mask material edge position;

selecting an optimum threshold value having the largest rate of change for each measuring point;

selecting a threshold value from the plurality of optimum threshold values; and providing the selected threshold value to a proximity effect correction process which modifies the mask material edge position to compensate for proximity effects.

20. The method according to claim 19, wherein selecting a threshold value includes determining the mean of the selected optimum threshold values for each measuring point.

21. The method according to claim 19, wherein selecting a threshold value includes determining the median of the selected optimum threshold values for each measuring point.

22. A computer program product comprising a memory having computer program logic recorded thereon for enabling a processor in a computer system to determine an optimum process point for fabricating a device feature of a critical dimension, the computer program logic comprising:

a first calculating process enabling the processor to calculate a modeled behavior value associated with the device feature and a rate of change of the modeled behavior value over a range of corresponding values of a first process parameter representative of mask material edge position;

a second calculating process enabling the processor to select an optimum threshold value having the largest rate of change; and a determining process enabling the processor to determine the value of the first process parameter corresponding to the optimum threshold value.

23. The computer program product of claim 22, further comprising:

a providing process enabling the processor to provide the optimum threshold value to a proximity effect correction process which modifies the mask pattern to compensate for proximity effects.

24. The computer program according to claim 22, wherein the first process parameter is a mask material edge position and the rate of change of the modeled behavior value indicates the process latitude in forming the device feature associated with a particular mask material edge position.

25. A computer system, comprising:

a processor;

a memory operatively coupled to the processor;

a first calculating process enabling the processor to calculate a modeled behavior value associated with the device feature and a rate of change of the modeled behavior value over a range of corresponding values of a first process parameter representative of mask material edge positions;

a second calculating process enabling the processor to select an optimum threshold value having the largest rate of change; and a determining process enabling the processor to determine the value of the first process parameter corresponding to the optimum threshold value.

26. The computer system of claim 25, further comprising a providing process enabling the processor to provide the optimum threshold value to a proximity effect correction process which modifies the mask pattern to compensate for proximity effects.

27. The computer system of claim 25, wherein the first process parameter is a mask edge position and the rate of change of the modeled value indicates the process latitude of an edge of the device feature.

* * * * *